United States Patent
Hanaoka

(10) Patent No.: US 9,613,944 B2
(45) Date of Patent: Apr. 4, 2017

(54) SEMICONDUCTOR DEVICE AND SWITCHING CIRCUIT

(71) Applicant: Sanken Electric Co., LTD., Niiza-shi, Saitama (JP)

(72) Inventor: Masayuki Hanaoka, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 133 days.

(21) Appl. No.: 14/572,890

(22) Filed: Dec. 17, 2014

(65) Prior Publication Data

US 2015/0171070 A1   Jun. 18, 2015

(30) Foreign Application Priority Data

Dec. 17, 2013 (JP) ................. 2013-259830

(51) Int. Cl.
   *H03K 3/00*      (2006.01)
   *H01L 27/02*     (2006.01)
   *H03K 17/567*    (2006.01)
   *H03K 17/687*    (2006.01)
   *H01L 27/06*     (2006.01)

(52) U.S. Cl.
   CPC ...... *H01L 27/0255* (2013.01); *H01L 27/0629* (2013.01); *H03K 17/567* (2013.01); *H03K 17/687* (2013.01)

(58) Field of Classification Search
   CPC ............ H01L 27/0255; H01L 27/0269; H03K 17/567; H03K 17/687
   USPC ........................................................ 327/109
   See application file for complete search history.

(56) References Cited

U.S. PATENT DOCUMENTS

| | | | | |
|---|---|---|---|---|
| 5,097,302 A | * | 3/1992 | Fujihira | H01L 27/0248 257/139 |
| 5,621,601 A | * | 4/1997 | Fujihira | H01L 27/0248 361/115 |
| 5,736,774 A | * | 4/1998 | Fujihira | H01L 27/0229 257/369 |
| 8,129,780 B2 | * | 3/2012 | Shinbori | H01L 29/407 257/311 |
| 2002/0014940 A1 | * | 2/2002 | Kondo | H01F 38/12 336/96 |
| 2005/0162798 A1 | * | 7/2005 | Kato | H03K 17/0828 361/111 |
| 2015/0084533 A1 | * | 3/2015 | Naito | H01L 29/7395 315/209 T |

FOREIGN PATENT DOCUMENTS

JP     2005-209943 A     8/2005

* cited by examiner

*Primary Examiner* — Ryan Jager
(74) *Attorney, Agent, or Firm* — Banner & Witcoff, Ltd.

(57) ABSTRACT

A semiconductor device includes: a main switching element, a current-sensing switching element and a surge protection element, which are formed on a single semiconductor substrate, wherein the surge protection element is a bidirectional diode connected between a first main electrode of the main switching element and a first main electrode of the current-sensing switching element. Also, a switching circuit includes the semiconductor device and a detection resistor connected to the first main electrode of the current-sensing switching element; and a driving device that drives the semiconductor device based on a voltage drop occurring in the detection resistor when the semiconductor device is turned on.

9 Claims, 7 Drawing Sheets

FIG.10  -BACKGROUND ARTns of the same current is
SEMICONDUCTOR DEVICE AND SWITCHING CIRCUIT

BACKGROUND

The present invention relates to a semiconductor device and a switching circuit, and specifically, to a semiconductor device and a switching circuit for switching of a high voltage/large-current.

TECHNICAL FIELD

As a semiconductor device for switching of a high voltage/large-current, it is known that a semiconductor device uses MOSFET, IGBT or the like, as a main switching element thereof. Also, a semiconductor device is also known, in which, in order to detect a current flowing through the main switching elements, a current-sensing switching element is formed on the same semiconductor substrate as that of the main switching element. Japanese Patent Application Publication No. 2005-209943 discloses a semiconductor device of a background art, in which a current-sensing switching element and a main switching element are formed on the same semiconductor substrate, and a switching circuit of the background art using the same.

FIG. 10 is an equivalent circuit diagram showing configurations of a semiconductor device of the background art. The semiconductor device 200 of the background art has a current-sensing switching element 202 and a main switching element 201. Meanwhile, the semiconductor device 200 of the background art includes a surge protection resistor 203 as a means for protecting the current-sensing switching element 202 against a failure due to an external surge. The main switching element 201 includes a first IGBT as a power element. The current-sensing switching element 202 includes a second IGBT as a current-sensing element. The main switching element 201 and the current-sensing switching element 202 are formed on a single P+ semiconductor substrate. The surge protection resistor 203 is connected between an emitter electrode of the main switching element 201 and an emitter electrode of the current-sensing switching element 202. If a surge current due to the external surge attempts to flow through the current-sensing switching element 202, the surge protection resistor 203 limits the current. Thus, the surge current is not so increased.

However, when the main switching element 201 is turned on, a small current proportional to an current flowing through the main switching element 201 flows from an emitter of the current-sensing switching element 202 to a detection resistor 204. Simultaneously, the small current also flows through the surge protection resistor 203. Accordingly, as compared to a case where the surge protection resistor 203 is not provided, a voltage drop across both ends of the detection resistor 204 with respect to the same current is decreased. Namely, the surge protection resistor 203 reduces a current detection accuracy in the semiconductor device 200 in the background art.

SUMMARY

The present invention provides a semiconductor device and a switching circuit, in which a current-sensing switching device is protected from a failure due to an external surge and also a current detection accuracy is improved.

According to one aspect of the invention, a semiconductor device includes a main switching element, a current-sensing switching element and a surge protection element, which are formed on a single semiconductor substrate, wherein the surge protection element is a bidirectional diode connected between a first main electrode of the main switching element and a first main electrode of the current-sensing switching element.

Also, according to another aspect of the invention, A switching circuit includes a semiconductor device comprising a main switching element, a current-sensing switching element and a surge protection element, which are formed on a single semiconductor substrate, wherein the surge protection element is a bidirectional diode connected between a first main electrode of the main switching element and a first main electrode of the current-sensing switching element; a detection resistor connected to the first main electrode of the current-sensing switching element; and a driving device that drives the semiconductor device based on a voltage drop occurred in the detection resistor when the semiconductor device is turned on.

According to the present invention, a semiconductor device and a switching circuit, in which a current-sensing switching device is protected from a failure due to an external surge and also a current detection accuracy is improved can be provided.

BRIEF DESCRIPTION OF THE DRAWINGS

FIG. 10 is an equivalent circuit diagram showing configurations of a semiconductor device described in the background art.

DETAILED DESCRIPTION

Figure 1:
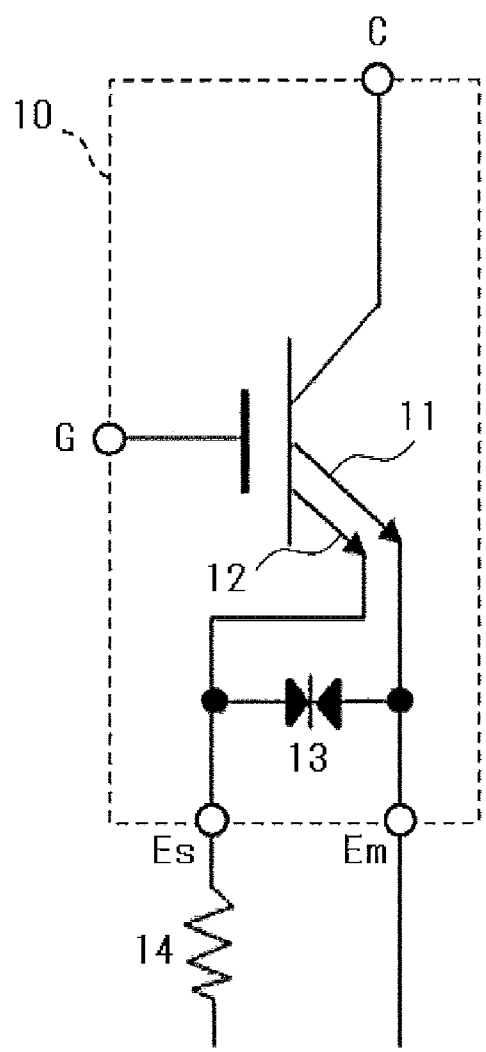
FIG. 1 is an equivalent circuit diagram showing configurations of a semiconductor device according to a first embodiment of the present invention.

Hereinafter, embodiments of the present invention will be described with reference to the drawings. In the following descriptions of the drawings, the same or similar components are designated by the same or similar reference numerals. Incidentally, it should be noted that the drawings are schematically shown. Meanwhile, the embodiments as described below are intended to illustrate a device or a method for embodying the technical spirits of the invention, and accordingly, the embodiments of the invention are not intended to limit structures, arrangements or the like of components to the following. The embodiments of the invention can be variously modified within the scope of the claims.

(First Embodiment) FIG. 1 is an equivalent circuit diagram showing configurations of a semiconductor device according to a first embodiment of the present invention.

The semiconductor device 10 according to the present invention is a semiconductor device including a main switching element 11, a current-sensing switching element 12 and a surge protection element 13, which are formed on a single semiconductor substrate. Additionally, the surge protection element 13 is a bidirectional diode connected between a first main electrode (emitter electrode) Em of the main switching element and a first main electrode (emitter electrode) Es of the current-sensing switching element.

In the present embodiment, the main switching element 11 is a first IGBT (insulated-gate bipolar transistor) and the current-sensing switching element 12 is a second IGBT. A collector electrode (second main electrode) C and a gate electrode (control electrode) G of the IGBT are shared between the main switching element 11 and the current-sensing switching element 12. Also, the main switching element 11 has an emitter electrode Em as the first main electrode and the current-sensing switching element 12 has an emitter electrode Es as the first main electrode. In addition, the emitter electrode Em is grounded, and the emitter electrode Es is grounded via a detection resistor 14 provided outside the semiconductor device 10. The semiconductor device 10 can switch an on-state and an off-state between the collector electrode C and the emitter electrodes Es and Em in response to a voltage applied to the gage electrode G. In the on-state of the semiconductor device 10, when an current is flowed in from the collector electrode C, a small current proportional to an current flowing through the emitter electrode Em of the main switching element 11 flows through the emitter electrode Es of the current-sensing switching element 12. A current flowed out from the emitter electrode Es flows through the detection resistor 14, thereby occurring a voltage drop. The voltage drop is outputted to a driving device as described below, so that a value of the current flowed out from the emitter electrode Em can be detected by the driving device.

In the present embodiment, the surge protection element 13 is an NPN bidirectional diode connected between the emitter electrode Em and the emitter electrode Es. The surge protection element 13 breaks down if a voltage applied across both ends thereof exceeds a predetermined withstanding voltage value, thereby causing a current to flow. The withstanding voltage value of the surge protection element 13 is set to be larger than the voltage drop caused by the detection resistor 14 during a normal operation, for example to be 5-30 times the voltage drop. The withstanding voltage value of the surge protection element 13 is mainly set based on a value of a current flowing through the semiconductor device 10, a resistance value of the detection resistor 14 and a current detection accuracy of the driving device.

Figure 2:
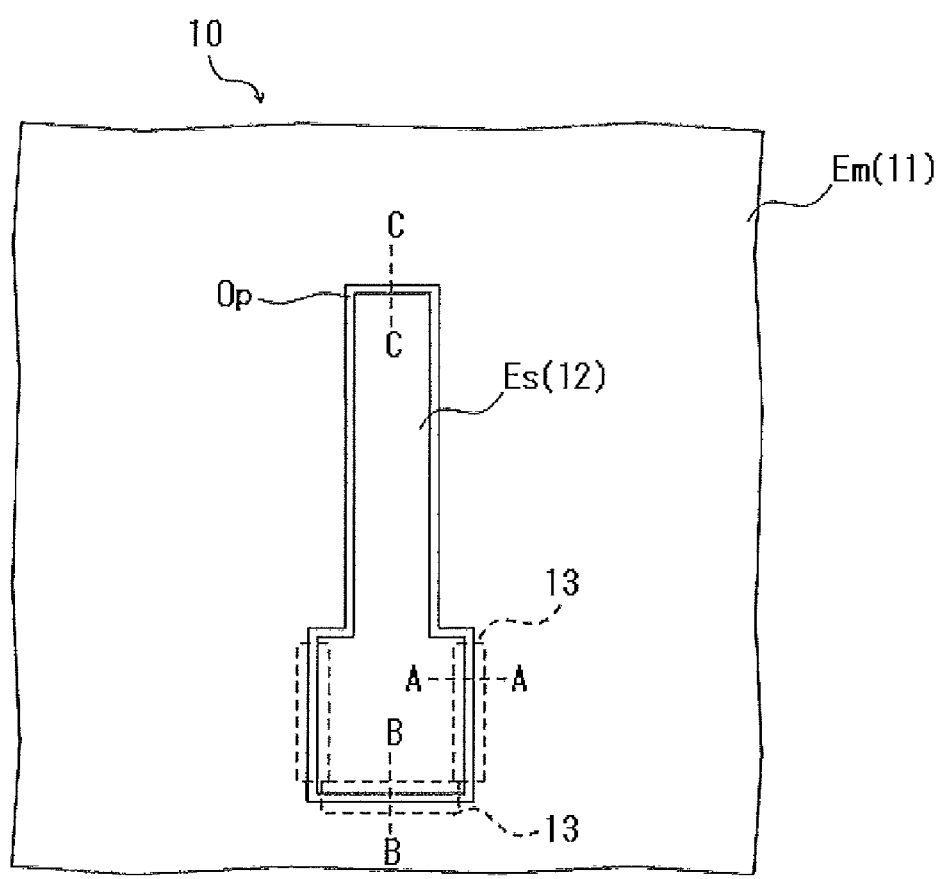
FIG. 2 is a plan view showing configurations of the semiconductor device according to the first embodiment of the invention.

Next, the detailed configurations of the semiconductor device 10 according to the present embodiment will be described with reference to FIGS. 2 to 5. FIG. 2 is a plan view showing configurations of the semiconductor device according to the first embodiment of the invention. As viewed in the plan view, the main switching element 11 occupies the majority of the semiconductor substrate, and the current-sensing switching element 12 occupies a part smaller than the main switching element 11. The current-sensing switching element 12 has a common cell structure with the main switching element 11 and includes the emitter electrode Es divided from the emitter electrode Em by an opening Op. The surge protection element 13 is formed, as shown in a dotted line, in a peripheral region of a pad part (generally square part) of the current-sensing switching element 12.

Figure 3:
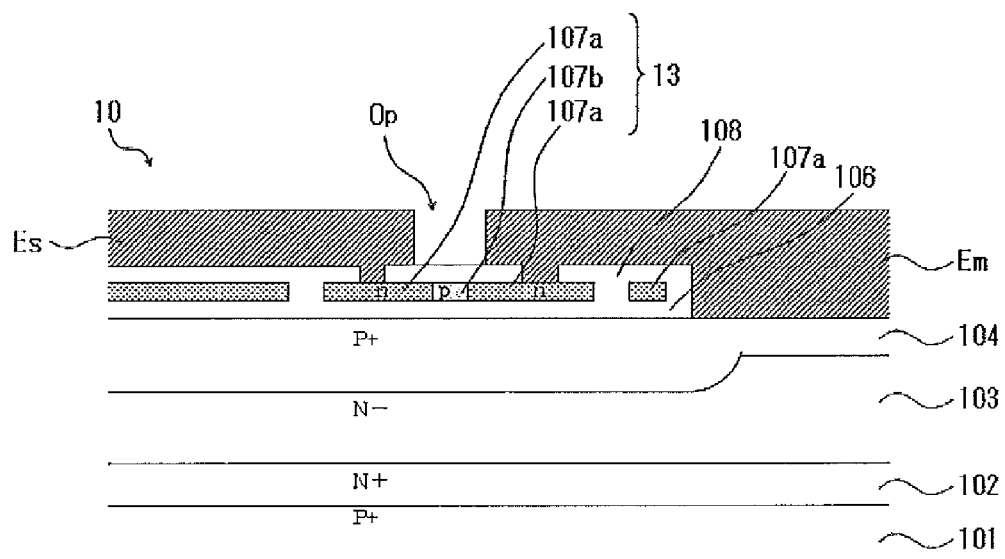
FIG. 3 is an A-A sectional view of FIG. 2.
Figure 4:
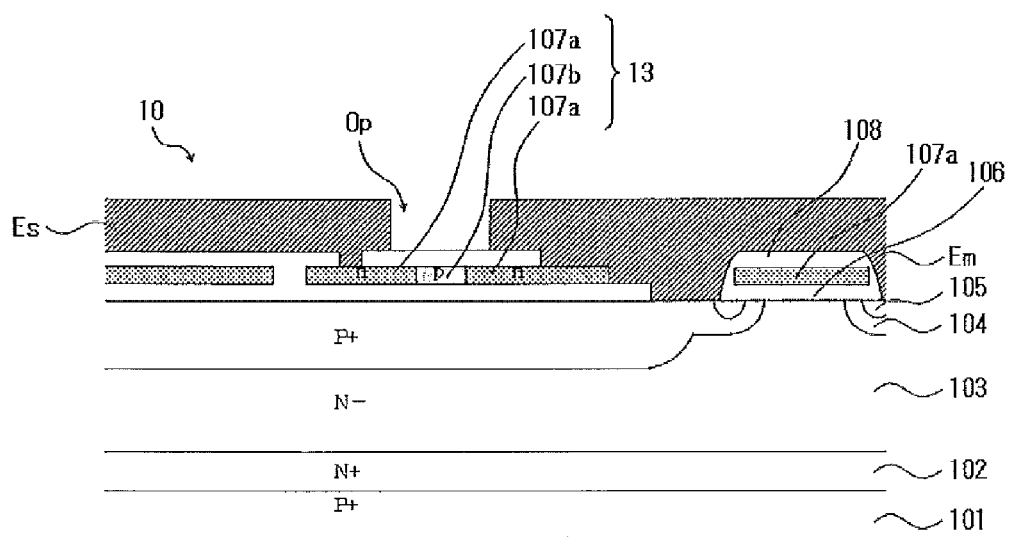
FIG. 4 is a B-B sectional view of FIG. 2.
Figure 5:
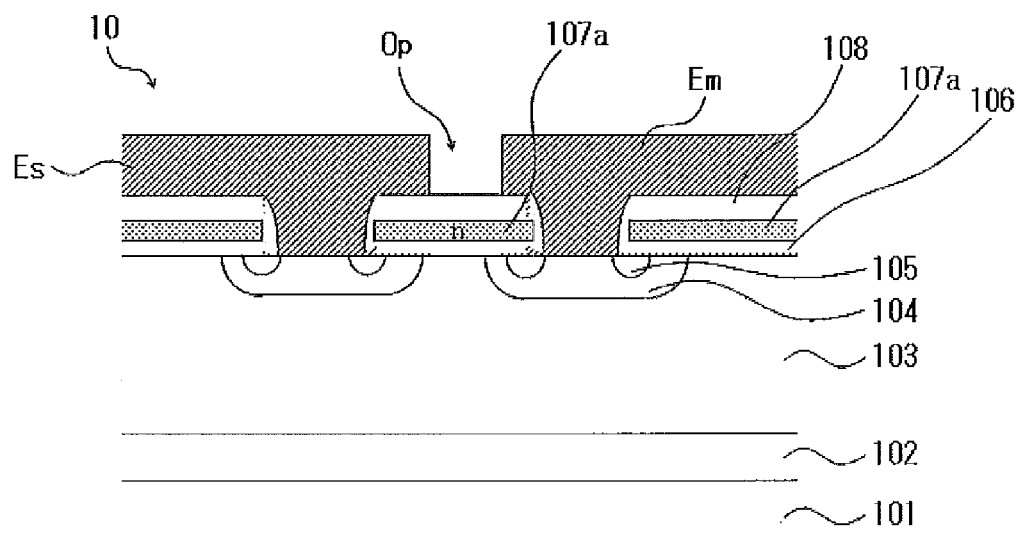
FIG. 5 is a C-C sectional view of FIG. 2.

FIG. 3 is an A-A sectional view of FIG. 2, FIG. 4 is a B-B sectional view of FIG. 2, and FIG. 5 is a C-C sectional view of FIG. 2. In FIGS. 2 to 5, a sectional structure of the main switching element 11 is shown on the right side of the opening Op as a boundary and a sectional structure of the current-sensing switching element 12 is shown on the left side.

The semiconductor substrate configuring the semiconductor deice 10 includes a P+ collector region 101, a N+ buffer region 102, a N− drift region 103, a P+ base region 104 and a N+ emitter region 105. The collector region 101 is entirely exposed on a back surface of the semiconductor substrate. The buffer region 102 is provided to be in contact with an upper surface of the collector region 101. The drift region 103 is provided to be in contact with an upper surface of the buffer region and is partially exposed on a front surface of the semiconductor substrate. The base region 104 is provided in an island shape at upper side of the drift region and partially exposed on the front surface of the semiconductor substrate. The emitter region 105 is provided in an island shape at upper side of the base region 104 and partially exposed on the front surface of the semiconductor substrate.

In the present embodiment, the main switching element 11 is connected to the current-sensing switching element 12 via the base region 104 inside the semiconductor substrate. Alternatively, the main switching element 11 and the current-sensing switching element 12 may be divided from each other inside the semiconductor substrate by separating the base region 104 just under the opening Op.

As shown in FIG. 5, a cell structure of the current-sensing switching element 12 is formed in a region except the pat part (generally square part). The pad part is a part on which wire bonding is to be performed during a subsequent process and is not provided with a cell structure just under thereof, thereby enhancing reliability of the semiconductor device 10.

The semiconductor device 10 includes a gate insulation layer 106, poly-silicon layers 107a and 107b, an interlayer insulation layer 108 and the emitter electrodes Em and Es. The gate insulation layer 106 is provided to be in contact with the front surface of the semiconductor substrate to insulate the poly-silicon layers 107a and 107b from the semiconductor substrate. The poly-silicon layers 107a and 107b are respectively made of poly-silicons to which N-type and P-type impurities are added, and are provided on an upper surface of the gate insulation layer 106. The poly-silicon layer 107 formed in the cell structure serves as the gate electrode G. The interlayer insulation layer 108 is provided to be in contact with upper surfaces of the poly-silicon layers 107a and 107b to partially insulate the emitter electrodes Em and Es from the poly-silicon layers 107a and 107b. The emitter electrodes Em and Es are provided to be in contact with upper surfaces of the semiconductor substrate and the interlayer insulation layer 108.

In a region shown by a dotted line in FIG. 2, the poly-silicon layer 107b is provided to be sandwiched between the poly-silicon layer 107a connected to the emitter electrode Em and the poly-silicon layer 107a connected to the emitter electrode Es. The poly-silicon layer 107b is contacted with the poly-silicon layer 107a at both ends thereof. Accordingly, the poly-silicon layers 107a and 107b constitute the surge protection element 13 formed as an NPN bidirectional diode.

The surge protection element 13 is formed by selectively adding a P-type impurity to the N-type poly-silicon layer 107a formed on the surface of the gate insulation layer 106. As a result, a withstanding voltage value of the surge protection element 13 can be easily adjusted by changing concentrations of the N-type and P-type impurities or a region to which the P-type impurity is to be added.

Figure 6:
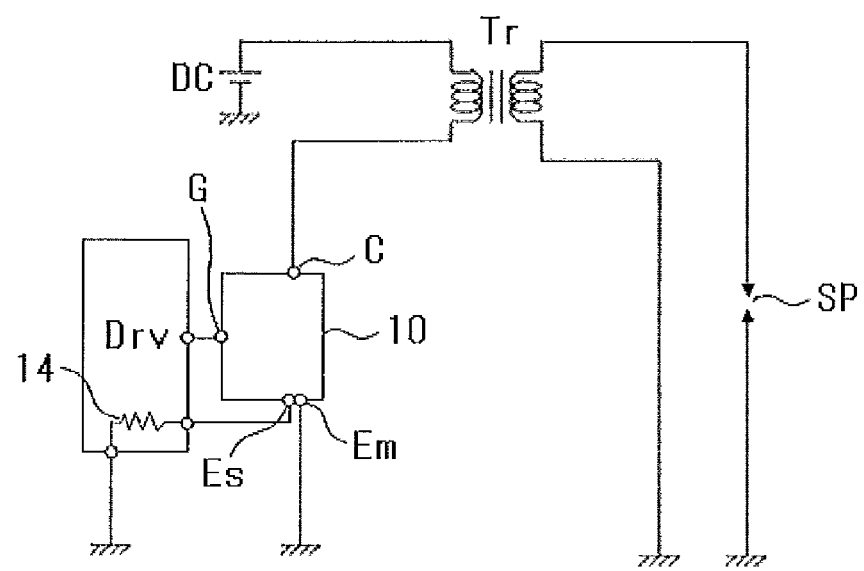
FIG. 6 is a circuit diagram showing configurations of a switching circuit according to the first embodiment of the invention.

FIG. 6 is a circuit diagram showing configurations of a switching circuit according to the first embodiment of the invention. The switching circuit according to the present embodiment has a semiconductor device 10 including a main switching element 11, a current-sensing switching element 12 and a surge protection element 13 formed on a single semiconductor substrate, wherein the surge protection element 13 is a bidirectional diode connected between a first main electrode Em of the main switching element 11 and a first main electrode Es of the current-sensing switching element 12; a detection resistor 14 connected to the first main electrode Es of the current-sensing switching element 12; and a driving device Drv for driving the semiconductor device 10 based on a voltage drop occurred in the detection resistor 14 when the semiconductor device 10 is turned on.

The switching circuit according to the present embodiment is an ignition circuit having the semiconductor device 10, a direct current power source Dc, the driving device Drv, a transformer Tr and a spark plug SP. The collector electrode C of the semiconductor device 10 is connected to one end of a primary winding of the transformer Tr. The emitter electrode Em of the main switching element 11 of the semiconductor device 10 is grounded. The emitter electrode Es of the current-sensing switching element 12 of the semiconductor device 10 is connected to the driving device Drv and is grounded via the detection resistor 14. The gate electrode of the semiconductor device 10 is connected to the driving device Drv. The other end of the primary winding of the transformer Tr is connected to the direct current power source Dc. One end of a secondary winding of the transformer Tr is grounded via the spark plug SP. The other end of the secondary winding of the transformer Tr is grounded.

The driving device Drv outputs a driving signal to the gate electrode G of the semiconductor device 10 thereby turning on and off the semiconductor device 10. When the semiconductor device 10 is in on-state, a current flows from the direct current power source Dc through the primary winding of the transformer Tr and the semiconductor device 10 so that energy is accumulated in the transformer Tr. The current flowing through the semiconductor device 10 is detected by the driving device Drv including the detection resistor 14. If the current flowing through the semiconductor device 10 exceeds a predetermined value, the driving device Drv switches the semiconductor device 10 from on-state to off-state. Thus, the energy accumulated in the transformer Tr is released from the secondary winding of the transformer Tr so that a spark is generated between electrodes of the spark plug SP.

As described above, according to the present embodiment, the surge protection element 13 breaks down if a voltage exceeding a predetermined withstanding voltage value is applied across both ends thereof, thereby causing a current to flow. Therefore, a voltage applied between the emitter electrodes Em and Es is suppressed to be lower than the withstanding voltage value of the surge protection element 13, thereby preventing a breakdown of the gate insulation layer 106 and the like.

Also, the withstanding voltage value of the surge protection element 13 is set to be five or more times the voltage drop caused by the detection resistor 14 during a normal operation. Namely, the withstanding voltage value of the surge protection element 13 is set to have a voltage value such that, during a normal operation of the switching circuit, a current value flowed out from the emitter electrode Em can be detected by the driving device Drv. Accordingly, the current flowing through the surge protection element 13 becomes negligibly small, so that a decrease in current detection accuracy of the driving device can be prevented without increasing an area of the current-sensing switching element 12.

Meanwhile, in the viewpoint of the detection accuracy, the withstanding voltage value of the surge protection element 13 has to be preferably higher. However, in this case an operation resistance of the surge protection element 13 upon breakdown becomes higher, so that the voltage applied between the emitter electrodes Em and Es is increased. In the viewpoint of the surge protection, the withstanding voltage value of the surge protection element 13 is preferably set to be 30 or less times the voltage drop caused by the detection resistor 14 during a normal operation.

Figure 7:
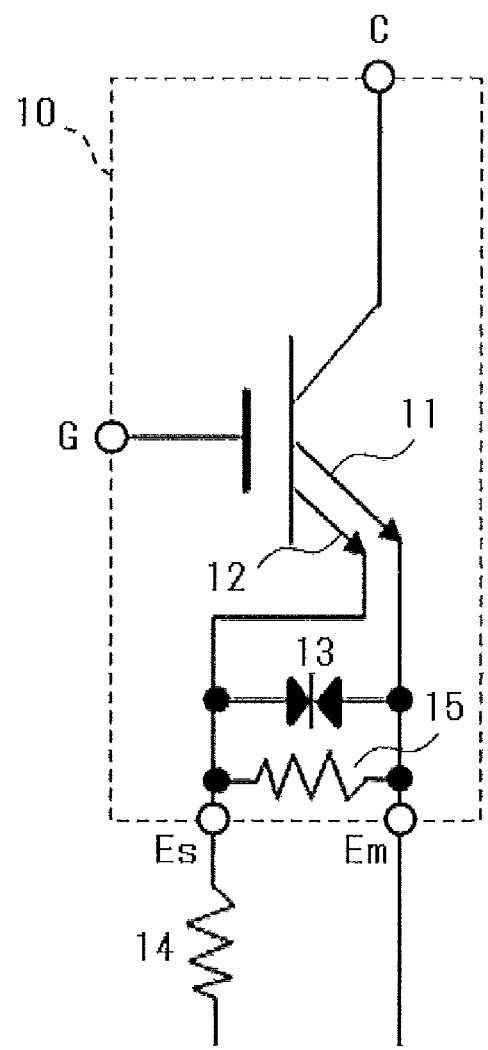
FIG. 7 is an equivalent circuit diagram showing configurations of a semiconductor device according to a second embodiment of the invention.

(Second Embodiment) FIG. 7 is an equivalent circuit diagram showing configurations of a semiconductor device according to a second embodiment of the present invention. The semiconductor device according to the present embodiment is different form the semiconductor device according to the first embodiment in that a resistor 15 is provided thereto.

The resistor 15 is connected in parallel with the surge protection element 13, between the emitter electrode Em and the emitter electrode Es. A resistance value of the resistor 15 is set to be at least larger than the resistance value of the detection resistor 14. Also, a voltage drop caused by the resistor 15 is set to be smaller than the withstanding voltage value of the surge protection element 13. Therefore, as compared to the semiconductor device according to the first embodiment, the semiconductor device 10 according to the present embodiment has a higher surge resistance, since a current is likely to flow through the resistor 15 from when a surge is initially applied.

Figure 8:
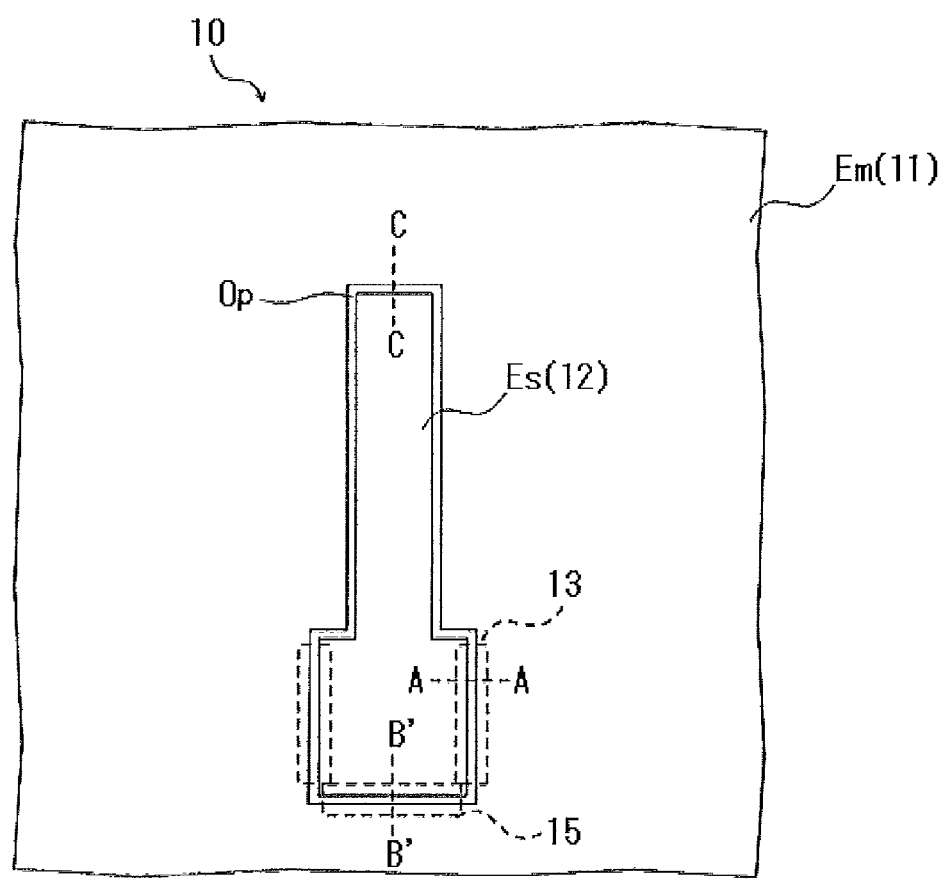
FIG. 8 is a plan view showing configurations of the semiconductor device according to the second embodiment of the invention.
Figure 9:
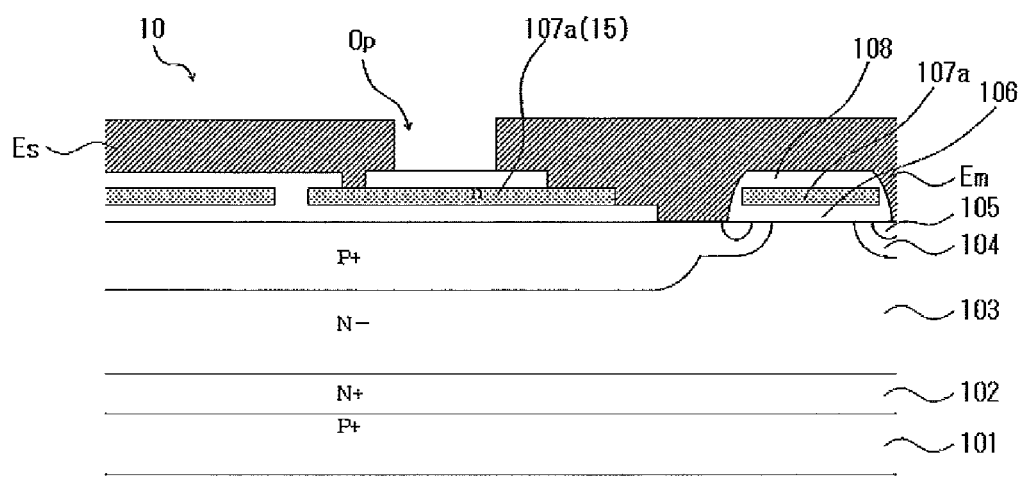
FIG. 9 is a B'-B' sectional view of FIG. 8.
Figure 9:
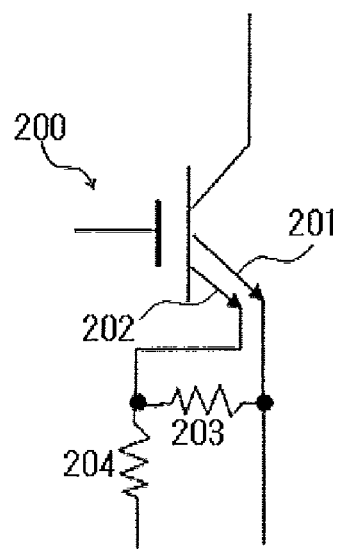

FIG. 8 is a plan view showing configurations of the semiconductor device according to the second embodiment of the present invention, and FIG. 9 is a B'-B' sectional view of FIG. 8. The resistor 15 is formed in the peripheral region, as shown in a dotted line, of a pad part (generally square part) of the current-sensing switching element 12. In the present embodiment, the resistor 15 is formed by an N-type poly-silicon layer 107a formed on a surface of the gate insulation layer 106. Therefore, the resistor 15 is simultaneously formed together with the poly-silicon layer 107a, which serves as parts of the gate electrode G and the surge protection element 13. Also, the resistance value of the resistor 15 can be adjusted depending on a pattern (length and width) of the poly-silicon layer 107a, thereby it is easily possible to respond to a modification of the driving device Drv.

As described above, although the present invention has been described based on the embodiments, it should not be understood that the discussion and the drawings, which constitute a part of the present disclosure, are intended to limit the invention. Various alternative embodiments, examples and operational techniques will become apparent to those skilled in the art from the disclosure. Namely, the invention is of course intended to include various embodiments and the like, which are not described herein. Accordingly, the technical scope of the invention is intended to be defined only by specific inventive matters according to the appended claims appropriate for the above description. For example, the main switching element 11 and the current-sensing switching element 12 are not limited to IGBTs, but may be MOSFETs. Also, the detection resistor 14 may be provided inside the semiconductor device 10. Further, the surge protection element 13 and the resistor 15 may formed using impurity regions in the semiconductor substrate. In addition, the switching circuit is not limited to the ignition circuit, but may be any other circuits using a semiconductor device including a current-sensing switching element and also the invention may be adapted in any manner.

What is claimed is:

1. A semiconductor device comprising:
 a main switching element, a current-sensing switching element and a surge protection element, which are formed on a single semiconductor substrate,
 wherein the surge protection element is a NPN bidirectional diode having a first terminal connected to a first main electrode of the main switching element and a second terminal connected to a first main electrode of the current-sensing switching element, the bidirectional diode breaking down causing a current to flow in a breaking down condition that a voltage applied across both ends exceeds a predetermined withstanding voltage.

2. The semiconductor device according to claim 1, wherein the surge protection element is formed by a poly-silicon layer arranged on the single semiconductor substrate with an interposing insulation layer.

3. The semiconductor device according to claim 1, further comprising
 a resistor connected in parallel with the surge protection element, between the first main electrode of the main switching element and the first main electrode of the current-sensing switching element.

4. The semiconductor device according to claim 3, wherein the resistor is formed by a poly-silicon layer arranged on the single semiconductor substrate with an interposing insulation layer.

5. The semiconductor device according to claim 3, further comprising
 a detection resistor connected between the first main electrode of the current-sensing switching element and ground,
 wherein a resistance value of the resistor is higher than a resistance value of the detection resistor.

6. The semiconductor device according to claim 1, further comprising
 a detection resistor connected between the first main electrode of the current-sensing switching element and ground,
 wherein a withstanding voltage of the surge protection element is higher than a voltage drop occurring in the detection resistor during a normal operation of the semiconductor device.

7. The semiconductor device according to claim 6, wherein the withstanding voltage of the surge protection element is 5 or more and 30 or less times the voltage drop occurring in the detection resistor during the normal operation of the semiconductor device.

8. A switching circuit comprising:
 a semiconductor device comprising a main switching element, a current-sensing switching element and a surge protection element, which are formed on a single semiconductor substrate, wherein the surge protection element is a NPN bidirectional diode having a first terminal connected to a first main electrode of the main switching element and a second terminal connected to a first main electrode of the current-sensing switching element, the bidirectional diode breaking down causing a current to flow in a breaking down condition that a voltage applied across both ends exceeds a predetermined withstanding voltage;
 a detection resistor connected to the first main electrode of the current-sensing switching element; and
 a driving device that drives the semiconductor device based on a voltage drop occurring in the detection resistor when the semiconductor device is turned on.

9. The semiconductor device according to claim 8, wherein the bidirectional diode includes:
 a first poly-silicon layer to which a first-conductivity-type impurity is added;
 a second poly-silicon layer to which the first-conductivity-type impurity is added; and
 a third poly-silicon layer to which a second-conductivity-type impurity different from the first-conductivity-type impurity is added, wherein the third poly-silicon layer is interposed between the first poly-silicon layer and the second poly-silicon layer.

* * * * *